United States Patent
Sun

(10) Patent No.: US 10,560,105 B1
(45) Date of Patent: Feb. 11, 2020

(54) DELAY-LOCKED LOOP WITH LARGE TUNING RANGE

(71) Applicant: QUALCOMM Incorporated, San Diego, CA (US)

(72) Inventor: Bo Sun, Carlsbad, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/175,610

(22) Filed: Oct. 30, 2018

(51) Int. Cl.
| | |
|---|---|
| *H03L 7/08* | (2006.01) |
| *H03L 7/081* | (2006.01) |
| *H03K 5/14* | (2014.01) |
| *H04L 7/00* | (2006.01) |
| *H04L 7/033* | (2006.01) |
| *H03L 7/093* | (2006.01) |
| *H03K 5/00* | (2006.01) |

(52) U.S. Cl.
CPC .............. *H03L 7/0802* (2013.01); *H03K 5/14* (2013.01); *H03L 7/0807* (2013.01); *H03L 7/0812* (2013.01); *H03L 7/093* (2013.01); *H04L 7/0037* (2013.01); *H04L 7/0331* (2013.01); *H03K 2005/00078* (2013.01)

(58) Field of Classification Search
CPC ......... H03L 7/0818; H03L 7/091; H03L 7/16; H04L 7/0037; H04L 7/033; G11C 7/222
See application file for complete search history.

(56) References Cited

U.S. PATENT DOCUMENTS

| | | | |
|---|---|---|---|
| 5,801,562 A * | 9/1998 | Fujii ..................... | H03K 5/135 326/93 |
| 5,969,552 A | 10/1999 | Lee et al. | |
| 6,445,231 B1 | 9/2002 | Baker et al. | |
| 7,161,398 B2 | 1/2007 | Park et al. | |
| 2002/0154723 A1* | 10/2002 | Nakamura ............... | H03L 7/07 375/376 |
| 2004/0070431 A1* | 4/2004 | Henrickson .......... | H03L 7/0814 327/149 |
| 2006/0261869 A1* | 11/2006 | Gomm ................. | H03L 7/0812 327/158 |
| 2011/0291719 A1* | 12/2011 | Ok ........................ | H03L 7/0805 327/158 |
| 2015/0256187 A1* | 9/2015 | Hwang ................. | H03L 7/0802 365/194 |
| 2016/0109923 A1* | 4/2016 | Chen ..................... | G06F 1/3296 |

* cited by examiner

Primary Examiner — Khanh C Tran
(74) Attorney, Agent, or Firm — Haynes and Boone, LLP

(57) ABSTRACT

A delay-locked loop (DLL) is provided that includes both a first delay line and a second delay line. The delay-locked loop functions to synchronize a DLL output clock signal relative to a received clock signal using the first delay line while a phase difference between the received clock signal and a received data signal corresponds to a delay within an operating range for the first delay line. As the phase difference increases to force the first delay line out of its operating range, the delay-locked loop transitions to using the second delay line to synchronize the DLL output clock signal relative to the received clock signal.

19 Claims, 4 Drawing Sheets

DELAY-LOCKED LOOP WITH LARGE TUNING RANGE

TECHNICAL FIELD

This application relates to delay-locked loops, and more particularly to a delay-locked loop with an increased tuning range.

BACKGROUND

In source-synchronous systems, it is conventional for the receiver to align a clock signal with the data using a phase interpolator that includes a delay-locked loop. In such systems, a phase detector in the delay-locked loop detects a phase difference between the clock signal and the data. A loop filter in the delay-locked loop filters the phase detector output to produce a control voltage that controls a delay applied by a delay line to the received clock signal. In response to the control voltage, the delay line adaptively delays the received clock to produce a delayed clock signal (which may also be denoted as an interpolated clock signal). The delaying of the received clock signal to form the delayed clock signal keeps the delayed clock signal centered in the data eye for the received data so that the received data may be sampled accordingly by the delayed clock signal.

But the demands placed on the delay line are exacerbated as the data rates are pushed to greater and greater rates. At these higher data rates (which also correspond to an increased source-synchronous clock rate), the received clock signal may be out of phase with the received data signal by several clock periods. This phase difference between the received data signal and the received clock signal will vary with process, voltage, and temperature variations. A delay line for source-synchronous operation at high data rates (e.g., in excess of 10 GHz) typically requires a wide tuning range. But such a wide tuning range is directly correlated with increased power consumption, increased jitter, and increased phase noise. A reduced tuning range is conventionally preferred since such a tighter tuning range will reduce power consumption, jitter, and phase noise.

Accordingly, there is a need in the art for improved low-power source-synchronous systems having delay-locked loops offering a relatively wide tuning range while still providing reduced power consumption, jitter, and phase noise.

SUMMARY

A receiver for a source-synchronous system is provided with a delay-locked loop (DLL) having both a first delay line and a second delay line. The delay-locked loop functions to synchronize a DLL output clock signal relative to a received clock signal so that a sampling edge of the DLL output clock signal is positioned suitably within a data eye for a received data signal so that the receiver may sample the received data signal responsive to the DLL output clock signal. Depending upon a phase difference between the received clock signal and the received data signal, the DLL selects between the two delay lines to delay the received clock signal to form the DLL output clock signal. In particular, there is a first phase difference range over which the DLL selects for the first delay line. If the phase difference ranges to a handoff limit for the first phase difference range, the DLL selects for the second delay line to delay the received clock signal to form the DLL output clock.

Operation for the DLL would then proceed using the second delay line so long as the phase difference ranges within a second phase difference range over which the DLL selects for the second delay line. If the phase difference ranges to a handoff limit for the second phase difference range, the phase difference again maps to the first difference range due to the modulo behavior of the phase difference with respect to a clock period for the received clock signal. The DLL may thus handoff operation back to the first delay line should the phase limit be reached for operation using the second delay line.

The first phase difference range corresponds to a first delay operating range for the first delay line. Similarly, the second phase difference range corresponds to a second delay operating range for the second delay line. The total tuning range for the DLL encompasses a combination of the first phase difference range and second phase difference range such that the total tuning range may be greater than the individual operating ranges for the delay lines. In this fashion, the DLL may have a relatively low-power operation as well as reduced phase noise and jitter due to a relatively restricted operating range for each delay line yet the DLL still provides a relatively-wide total tuning range.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
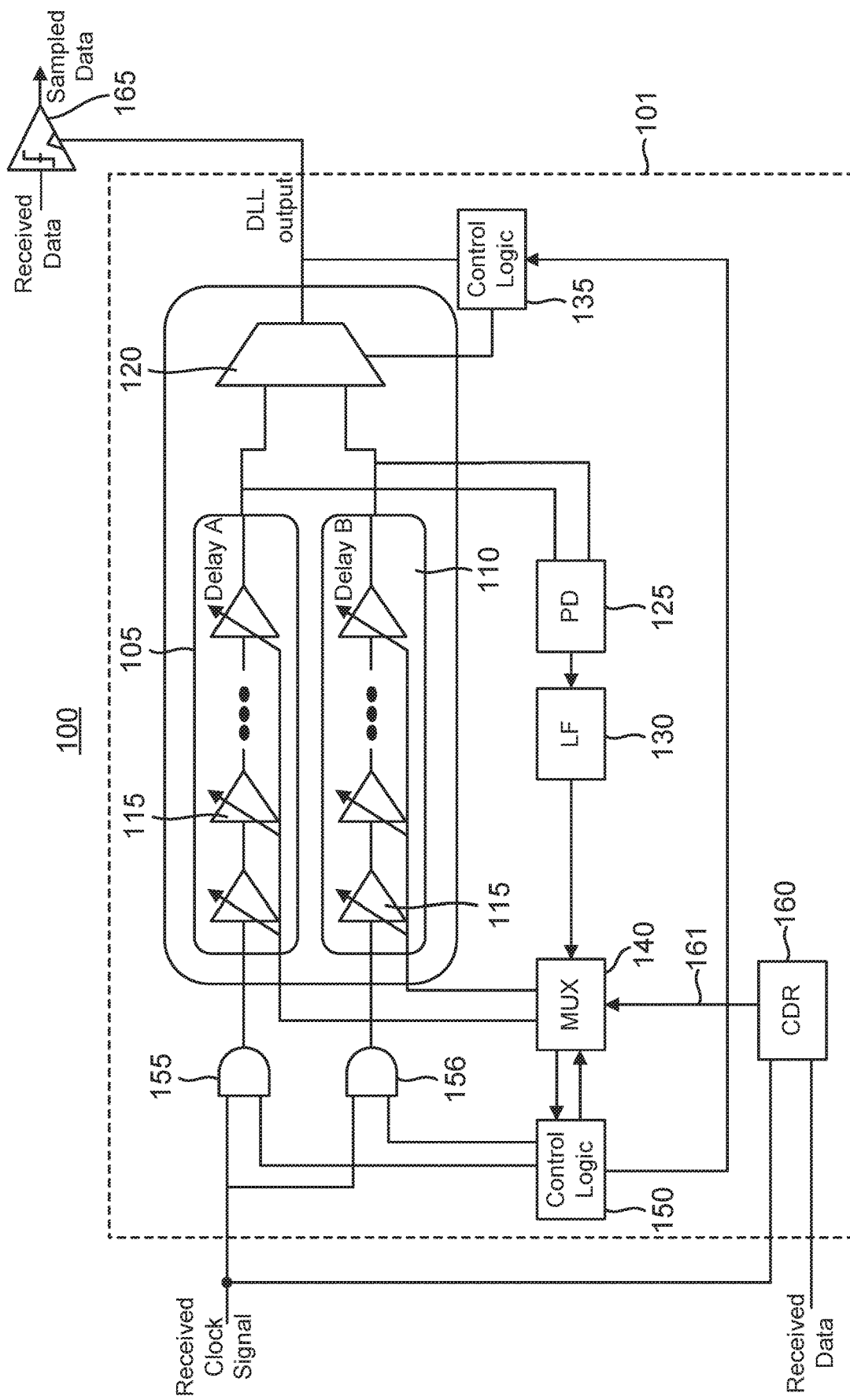
FIG. 1 is a circuit diagram of a receiver including a delay-locked loop having a first delay line and a second redundant delay line in accordance with an aspect of the disclosure.

To provide a relatively-wide tuning range without the conventional increase in power consumption, jitter, and phase noise, a delay-locked loop for a source-synchronous receiver is provided that includes both a first delay line and a redundant second delay line. The receiver receives a clock signal and also a data signal. For brevity, the received clock signal will simply be denoted as the clock signal in the following discussion. Similarly, the received data signal will be denoted as a data signal. The use of each delay line depends upon the phase difference between the clock signal and the data signal as determined by a clock data recovery (CDR) circuit for the delay-locked loop. While this difference is within a first phase range, the CDR circuit controls the first delay line to delay the clock signal by a first (adaptive) delay to form an output clock signal for the delay-locked loop circuit. In particular, the CDR circuit controls the first delay to correct for the phase difference so that the output clock signal has a clock edge that is suitably phased within a data eye for the data signal. As used herein, the "data eye" refers to the mid-range of the unit interval for the data signal that is suitably removed from the transitions from one unit interval to another. The first delay is proportional to the phase difference such that as the phase difference increases, the first delay is also increased by the CDR circuit to keep the sampling edge for the output clock signal edge (either a rising or a falling edge) within the data eye. But the first delay is limited by a tuning delay range for the first delay line. As noted earlier, the larger the tuning range is for a delay line within a delay-locked loop, the greater the power consumption, jitter, and phase noise for the resulting receiver including such a delay-locked loop.

It is thus desirable to keep the tuning range relatively small for the first delay line. But such a limited range may not be sufficient to properly sample the received data signal as the data rate is increased or decreased such that the phase difference increases beyond the first phase range. A controller in the delay-locked loop thus monitors whether the first delay equals an upper or lower transition delay. The upper transition delay corresponds to operation of the first delay line at the upper limit of its tuning range whereas the lower transition delay corresponds to operation of the first delay line at the lower limit of its tuning range. In the following discussion, each of the upper and lower transition delays will also be denoted as a handoff delay. Should the handoff delay be satisfied, the controller synchronizes the second delay line with the first delay line so that the second delay line also applies the handoff delay to the clock signal. The controller may then handoff operation to the second delay line as the phase difference between clock signal and the data signal ranges in a second phase range that overlaps with the first phase range such that both the first phase range and the second phase range includes the handoff phase. Following handoff to the second delay line, it is the second delay line that delays the clock signal to form the output clock signal for the delay-locked loop. Note that the handoff is glitch-less such that the handoff from one delay line to another occurs between the clock transition edges such that the resulting delayed output clock does not have runt pulses.

The second delay line has a tuning range that overlaps with the tuning range for the first delay line such that a minimum phase for the tuning range for the second delay line extends from slightly less than or equal to the handoff delay to a maximum phase. The total tuning range for the delay-locked loop is thus the sum of the tuning range for the first delay line and the non-overlapped portion of the tuning range for the second delay line. In general, the total tuning range should cover at least one clock period for the clock signal since the phase difference between the clock signal and the data signal is modulo 360 degrees. Thus, a phase difference of 370 degrees is equivalent to a phase difference of 10 degrees, a phase difference of 380 degrees is equivalent to a phase difference of 20 degrees, and so on. An example implementation will now be discussed.

Turning now to the drawings, an example receiver 100 shown in FIG. 1 includes a delay-locked loop (DLL) 101 having a first delay line 105 (delay line A) and a second delay line 110 (delay line B). During normal operation, one of delay line 105 and delay line 110 is selected to delay a clock signal (which is also denoted as a received clock signal) into a DLL output clock signal. This selection depends upon a phase difference between the clock signal and a data signal (which is also denoted as a received data signal) as determined by a clock data recovery (CDR) circuit 160.

As known in the DLL arts, CDR circuit 160 includes a phase detector (not illustrated) that detects the phase difference. The output of the phase detector is processed into a control signal 161 (e.g., a control voltage) using either analog or digital circuitry to control the delay applied by the selected delay line. In an analog implementation, CDR circuit 160 may include a charge pump (not illustrated) that drives a loop filter (not illustrated) based upon the output of the phase detector to produce control signal 161. In a digital implementation, a time-to-digital converter converts the phase detector output into a digital time difference that is processed by a digital filter to produce control signal 161. As with the analog implementation, these digital components are also not shown since their operation is well-understood in the DLL arts. Each of delay lines 105 and 110 includes a serial chain of delay circuits 115 having an adaptive delay responsive to control signal 161. The delay applied by each of delay lines 105 and 110 is thus a summation of the delay from each of its individual delay circuits 115.

Delay line 105 has a tuning range that may be distinct from a tuning range for delay line 110 except for an overlap region shared by both delay lines. A control logic circuit 150 monitors control signal 161 and controls a demultiplexer 140 that demultiplexes controls signal 161 (which may be an analog voltage or a digital code) to the appropriate delay line. In particular, control logic circuit 150 monitors whether control signal 161 is within a control range corresponding to the tuning range for the active delay line (either delay line 105 or delay line 110). Control logic circuit 150 thus uses control signal 161 as a proxy for the phase difference between the clock signal and the data signal. In that regard, the tuning range for delay line 105 extends from some minimum delay to a maximum delay. Should the phase difference correspond to a delay within this tuning range, control logic circuit 150 may select for delay line 105 to delay the clock signal to form the DLL output clock signal. To gate the clock signal to only drive the selected delay line, each delay line receives the clock signal through a corresponding logic gate such as an AND gate 155 for delay line 105 and an AND gate 156 for delay line 110. If the phase difference corresponds to operation with delay line 105, control logic circuit 150 thus drives AND gate 155 with a binary one signal and drives AND gate 156 with a binary zero signal. Conversely, if the phase difference corresponds to operation with delay line 110, control logic circuit 150 drives AND gate 156 with a binary one signal and drives AND gate 155 with a binary zero signal.

Each tuning range for delay lines 105 and 110 has an operating range that may be a subset of the delay line's tuning range. If the phase difference corresponds to a delay within one of the delay line's operating range, CDR circuit 160 then selects for operation with that delay line. The following discussion will be directed to an example operating scenario in which the delay for the active delay line increases to reach the upper limit of its operating range. But it will be appreciated that the same handoff technique from one delay line to another applies if the delay for the active delay decreases to reach its lower limit.

In general, the operating range may be the same as the tuning range, but it is more conservative to make the operating range be less than the full tuning range. For example, the operating range for delay line 105 may extend from the minimum delay for the tuning range for delay line 105 to a handoff delay that is less than the maximum delay for tuning range for delay line 105. In response to sensing through control voltage 161 that delay line 105 is applying the handoff delay, control logic circuit 150 drives AND gates 155 and 156 with a binary one signal so that delay line 110 may synchronize with delay line 105 and thus apply the same handoff delay to the clock signal. To detect this synchronization between the delay lines, a phase detector 125 senses a phase difference between the outputs of delay lines 105 and 110. A loop filter 130 filters the detected phase difference from phase detector 125 to provide a loop filter output signal that indicates whether delay lines 105 and 110 are synchronized. A control logic circuit 135 (which may be separate from or combined with control logic circuit 150) controls a glitch-less multiplexer 120 to select for the output of delay line 110 to form the DLL output clock signal in response to the synchronization of delay line 110 to delay line 105. Prior to this synchronization, control logic circuit 135 controlled glitch-less multiplexer 120 to select for the output of delay line 105 to form the DLL output clock signal. After the handoff of operation to second delay line 110, control logic circuit 150 shuts down delay line 105 by driving AND gate 155 with a logic zero signal. In contrast, logic gate 156 is maintained open while operation proceeds with delay line 110. In the following discussion, control logic circuit 135 and control logic circuit 150 may also be deemed to form a single controller for delay-locked loop 101.

Should the phase difference between the clock signal and the data signal continue to increase from the handoff phase, CDR circuit 160 continues to increase the delay applied by delay line 110 to the clock signal. But once the delay hits the limit for the operating range for delay line 110, control logic circuit 150 opens both AND gates 155 and 156 so that delay line 105 may synchronize to delay line 110. Following this synchronization, delay line 110 shuts down and operation proceeds with delay line 105. In this fashion, delay-locked loop may continue to keep the DLL output clock properly centered in the data eye while the phase difference between the clock signal and the data signal cycles through the operating ranges of both delay lines 105 and 110. Regardless of which delay line is currently selected for operation as dependent on the phase difference, a slicer 165 samples the data signal responsive to the DLL output clock signal to recover the sampled data. It will be appreciated that additional buffering may be performed on the DLL output clock signal prior to the clocking of slicer 165. In one implementation, control logic circuit 150 and control logic circuit 135 may be deemed to form a means for selecting first delay line 105 to delay the clock signal to form the DLL output clock signal responsive to the phase difference between the clock signal and the data signal corresponding to a delay within a first delay operating range for delay line 105 and for selecting second delay line 110 to delay the clock signal to form the DLL output clock signal responsive to the phase difference corresponding to a delay within a second delay operating range for second delay line 110.

Figure 2:
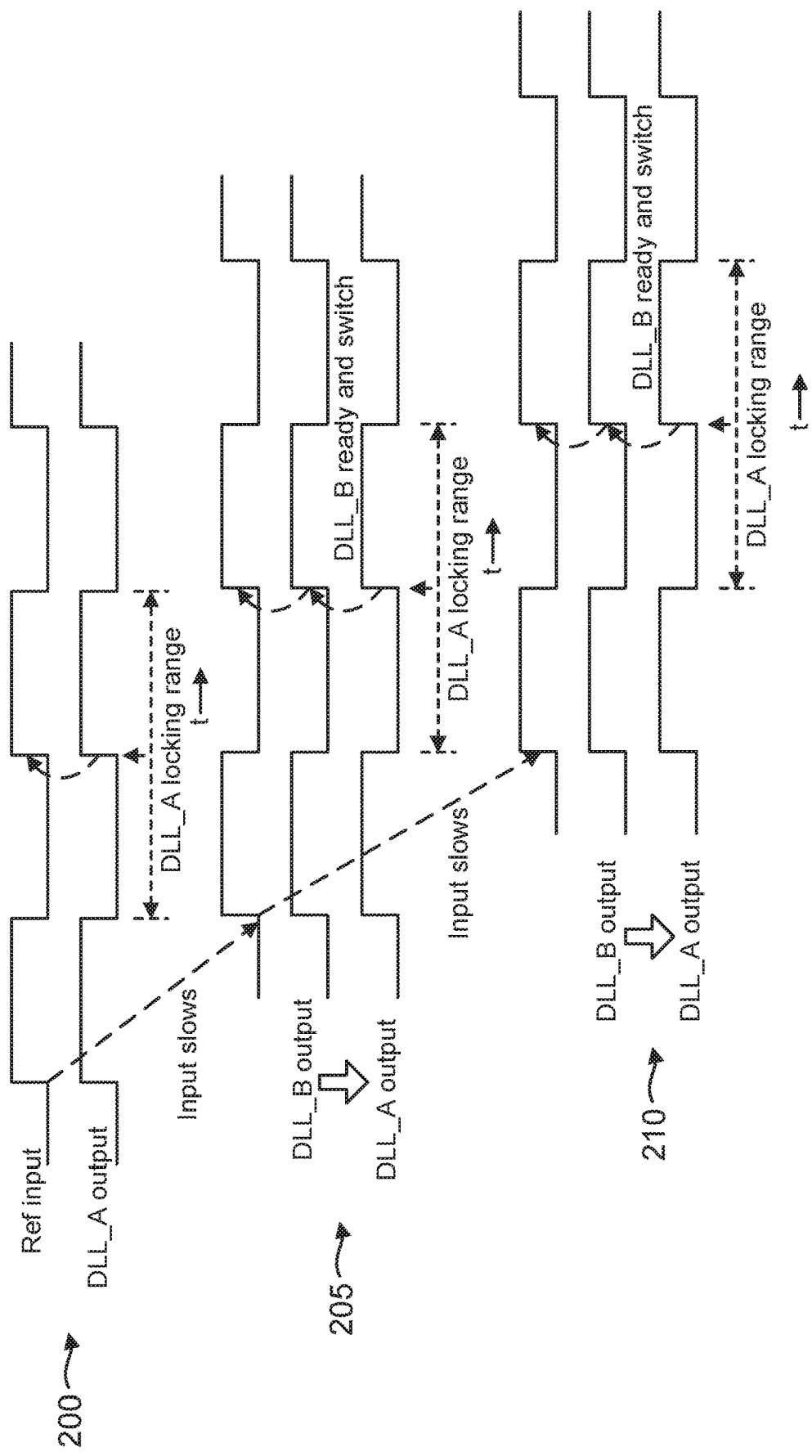
FIG. 2 illustrates the waveforms for the clock signal and the delay line output signals during a handoff from the first delay line to the second delay line in the delay-locked loop of FIG. 1

Some example waveforms for delay-locked loop 101 are shown in FIG. 2 during handoffs between delay line 105 and delay line 110. The output from delay line 105 is denoted as DLL_A output whereas the output from delay line 110 is denoted as DLL_B output. The clock signal is denoted as the reference input (Ref input). During a sequence 200 the phase difference between the clock signal and the data signal (not illustrated) lies with the operating range of delay line 105 (designated as DLL_A locking range). Thus, during sequence 200, the DLL_B output is quiescent since AND gate 156 (FIG. 1) is blocking delay line 110 from receiving the clock signal. A rising edge of the DLL_A output is locked to a corresponding rising edge of the reference input.

But the phase difference between the clock signal and the data signal may increase to the limit (handoff delay) of the operating range for delay line 105 as shown for a sequence 205. To begin the handoff to delay line 110, the DLL_B output is synchronized to the DLL_A output. Delay-locked loop 101 may then switch operation such that glitch-less multiplexer 120 selects for the DLL_B output.

The phase difference between the clock signal and the data signal may continue to increase such that the limit (handoff delay) of the operating range for delay line 110 is reached as shown for a sequence 210. To begin the handoff to delay line 105, the DLL_A output is synchronized to the DLL_B output. Delay-locked loop 101 may then switch operation such that glitch-less multiplexer 120 again selects for the DLL_A output.

Figure 3:
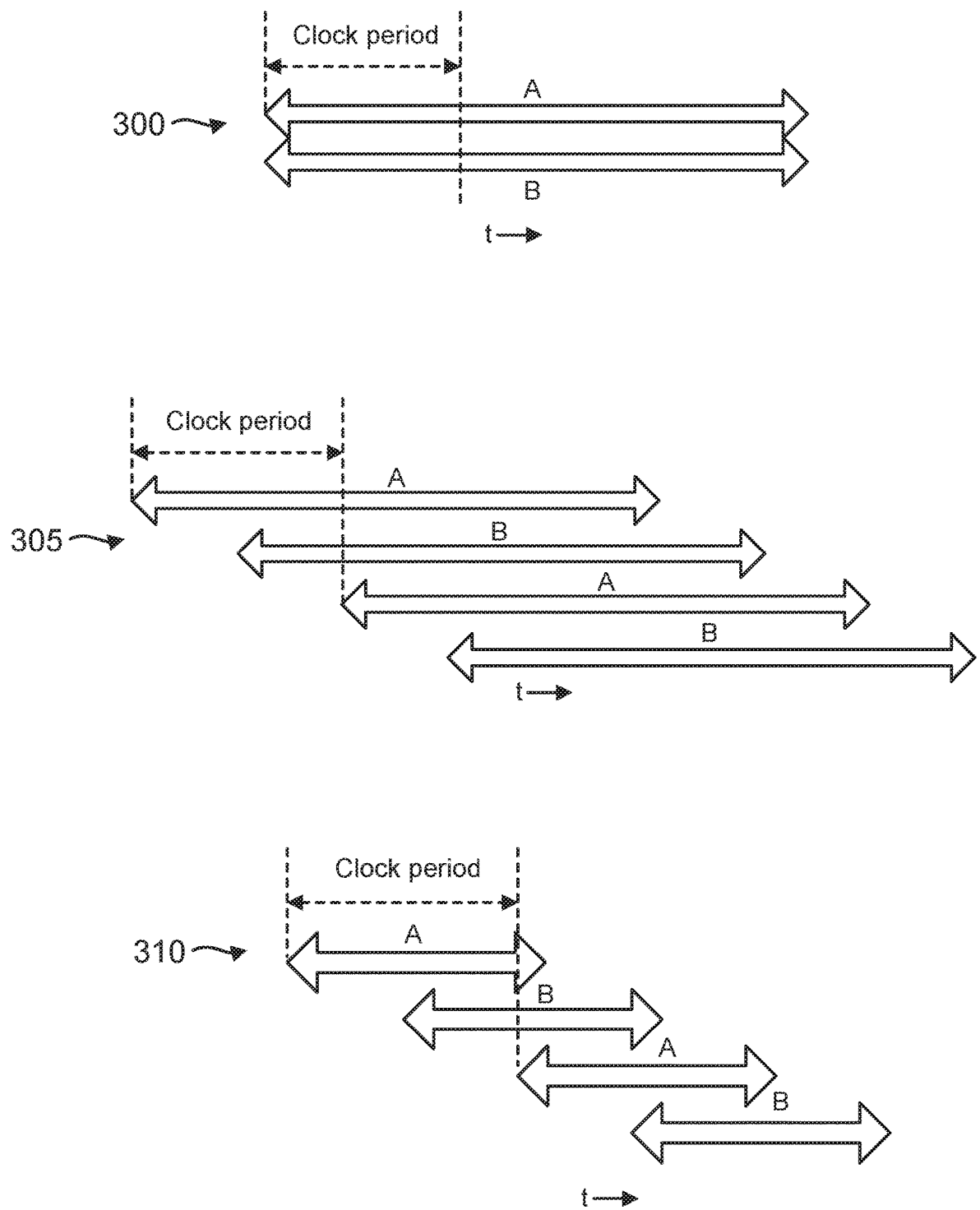
FIG. 3 illustrates three sample tuning ranges for the first delay line and for the second delay line in the delay-locked loop of FIG. 1

The operating ranges for delay line 105 and delay line 110 may have a variety of different relationships as shown in FIG. 3. The operating range for delay line 105 is designated as range A whereas the operating range for delay line 110 is designated as range B. For example, both range A and range B have the same minimum and maximum phase limits as shown for a range set 300. In other words, range B overlaps entirely with range A and has the same length. In such a case, both range A and range B should extend for a least a clock period. But to facilitate handoffs, both range A and range B in range set 300 are several clock periods in length. To extend the operating range, range B may be delayed with respect to range A as shown for a range set 305. In range set 305, range A is repeated to show its phase relationship to range B during a handoff from range B to range A. Similarly, range B is again repeated to show its phase relationship to range A during a second handoff from range A to range B. A range set 310 has a similar staggering of the ranges as shown for range set 305 except that range A and range B is each limited to approximately once clock period in length. Such a limiting of ranges A and B lowers the power consumption but increases the frequency of handoffs between ranges A and B.

Figure 4:
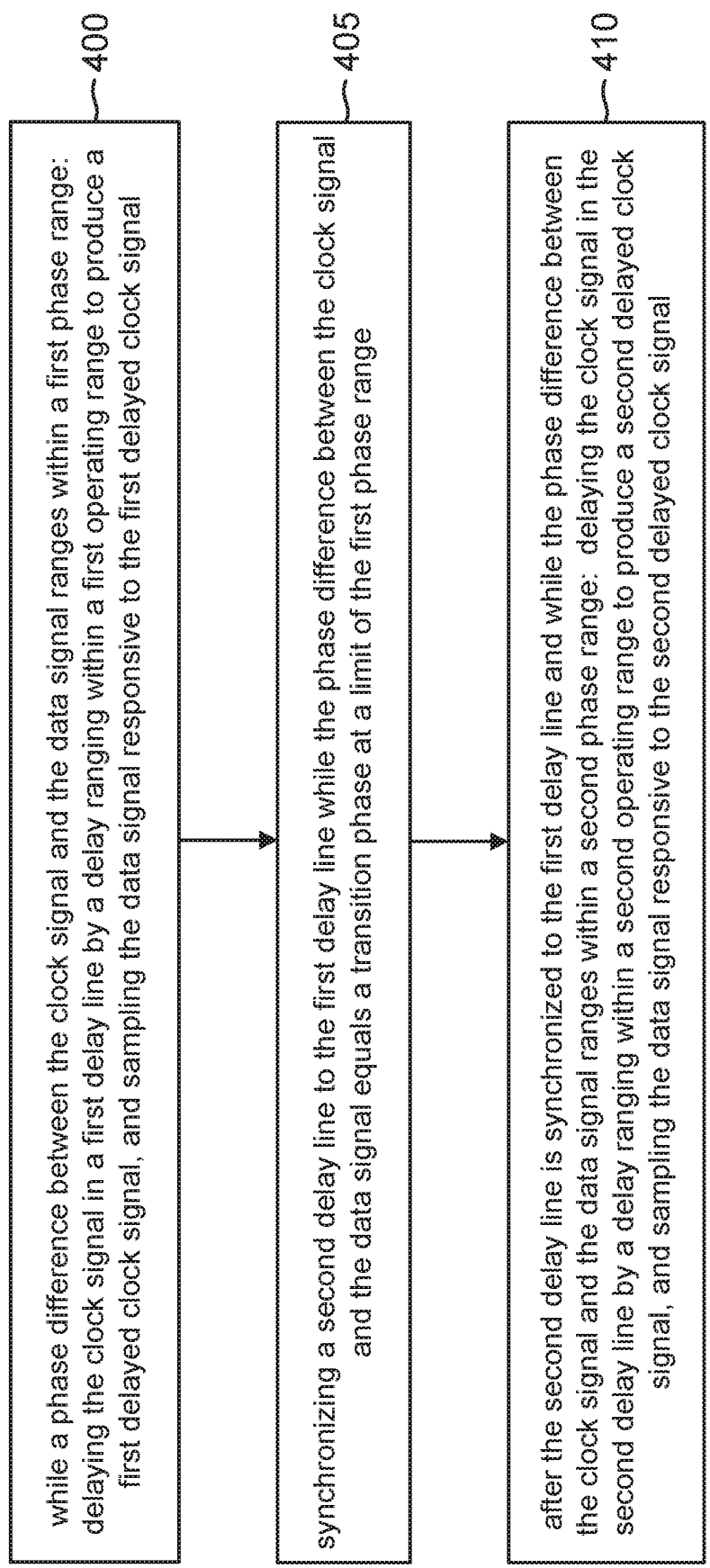
FIG. 4 is a flowchart for a method of operating a delay-locked loop having two delay lines to increase the tuning range of the delay-locked loop in accordance with an aspect of the disclosure.

A method of operation of a delay-locked loop will now be discussed with regard to the flowchart shown in FIG. 4. The method includes an act 400 that occurs while a phase difference between the clock signal and the data signal ranges within a first phase range. Act 400 comprises delaying the received clock signal in a first delay line by a delay ranging within a first tuning range to produce a first delayed clock signal and also sampling the received data signal responsive to the first delayed clock signal. Operation of receiver 100 while glitch-less multiplexer 120 selects for the output of delay line 105 to clock slicer 165 is an example of act 400. The method also includes an act 405 of synchronizing a second delay line to the first delay line while the phase difference between the clock signal and the data signal equals a transition phase at a limit of the first phase range. Recall that the handoff delay is reached in the operating range of delay line 105 when the phase difference between the clock signal and the data signal reaches the limit for the operating range for delay line 105. Thus, the synchronization of delay line 110 to delay line 105 that occurs when delay line 105 reaches its handoff delay is an example of act 405. An analogous handoff from delay line 110 to delay line 05 occurs when delay line 110 reaches the limit (either high or low) of its operating range. Finally, the method includes an act 410 that occurs after the second delay line is synchronized to the first delay line and while the phase difference between the clock signal and the data signal ranges within a second phase range. Act 410 includes delaying the clock signal in the second delay line by a delay ranging within a second tuning range to produce a second delayed clock signal and also sampling the data signal responsive to the second delayed clock signal. Operation of receiver 101 while glitch-less multiplexer 120 selects for the output of delay line 110 is an example of act 410.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A delay-locked loop, comprising:
   a first delay line;
   a second delay line;
   a controller configured to select between the first delay line and the second delay line based upon a phase difference between a clock signal and a data signal, wherein the controller is further configured to select for the first delay line to delay the clock signal to form a delay-locked loop output clock signal responsive to the phase difference corresponding to a delay within a delay operating range for the first delay line and to select for the second delay line to delay the clock signal to form the delay-locked loop output clock signal responsive to the phase difference corresponding to a delay within a delay operating range for the second delay line;
   a clock data recovery circuit configured to produce a control signal responsive to the phase difference between the clock signal and the data signal and to control a delay for the selected delay line responsive to the control signal; and
   a demultiplexer configured to receive the control signal, wherein the controller is further configured to control the demultiplexer to demultiplex the control signal to the first delay line responsive to the selection of the first delay line by the controller and to demultiplex the control signal to the second delay line responsive to the selection of the second delay line by the controller.

2. The delay-locked loop of claim 1, further comprising:
   a multiplexer configured to select between a first output signal from the first delay line and a second output signal from the second delay line, wherein the controller is further configured to control the multiplexer to select for the first output signal responsive to the phase difference between the clock signal and the data signal corresponding to the delay operating range for the first delay line and to select for the second output signal responsive to the phase difference between the clock signal and the data signal corresponding to the delay operating range for the second delay line.

3. The delay-locked loop of claim 2, wherein the multiplexer is a glitch-less multiplexer.

4. The delay-locked loop of claim 1, wherein the delay-locked loop is included within a receiver having a slicer configured to sample the data signal responsive to the delay-locked loop output clock signal.

5. A delay-locked loop, comprising:
   a first delay line;
   a second delay line;
   a controller configured to select between the first delay line and the second delay line based upon a phase difference between a clock signal and a data signal, wherein the controller is further configured to select for the first delay line to delay the clock signal to form a delay-locked loop output clock signal responsive to the phase difference corresponding to a delay within a delay operating range for the first delay line and to select for the second delay line to delay the clock signal to form the delay-locked loop output clock signal responsive to the phase difference corresponding to a delay within a delay operating range for the second delay line; and
   a clock data recovery circuit configured to produce a control signal responsive to the phase difference between the clock signal and the data signal and to control a delay for the selected delay line responsive to the control signal,
   wherein the delay operating range for the first delay line extends from a first minimum delay to a first handoff delay and the delay operating range for the second delay line extends from the first handoff delay to a second handoff delay, and wherein the controller is configured to handoff from a selection of the first delay line to a selection of the second delay line responsive to a delay for the first delay line increasing to equal the first handoff delay.

6. The delay-locked loop of claim 5, wherein the controller is further configured to handoff from a selection of the second delay line to a selection of the first delay line responsive to a delay for the second delay line increasing to equal the second handoff delay.

7. The delay-locked loop of claim 5, wherein the delay-locked loop further comprises:
   a phase detector configured to detect a phase difference between a first output signal from the first delay line and a second output signal from the second delay line; and
   a loop filter for filtering an output signal from the phase detector to form a loop filter output signal, wherein the controller is further configured to handoff from the selection of the first delay line to the selection of the second delay line after the loop filter output signal indicates that the second delay line is synchronized with the first delay line.

8. A delay-locked loop, comprising:
   a first delay line;
   a second delay line;
   a controller configured to select between the first delay line and the second delay line based upon a phase difference between a clock signal and a data signal, wherein the controller is further configured to select for the first delay line to delay the clock signal to form a delay-locked loop output clock signal responsive to the phase difference corresponding to a delay within a delay operating range for the first delay line and to select for the second delay line to delay the clock signal to form the delay-locked loop output clock signal responsive to the phase difference corresponding to a delay within a delay operating range for the second delay line;
   a clock data recovery circuit configured to produce a control signal responsive to the phase difference between the clock signal and the data signal and to control a delay for the selected delay line responsive to the control signal;
   a first logic gate; and a second logic gate, wherein the controller is further configured to control the first logic gate to pass the clock signal to the first delay line and to control the second logic gate to block the clock signal from the second delay line responsive to the selection of the first delay line by the controller, and wherein the controller is further configured to control the first logic gate to block the clock signal from the first delay line and to control the second gate to pass the clock signal to the second logic gate responsive to the selection of the second logic gate.

9. The delay-locked loop of claim 8, wherein the first logic gate comprises a first AND gate, and wherein the second logic gate comprises a second AND gate.

10. A method for a delay-locked loop in a receiver, comprising:

while a phase difference between a clock signal and a data signal ranges within a first phase range, delaying the clock signal in a first delay line by a delay ranging within a first delay range to produce a first delayed clock signal, and sampling the data signal responsive to the first delayed clock signal;

synchronizing a second delay line to the first delay line while the phase difference between the clock signal and the data signal equals a transition phase at a limit of the first phase range; and after the second delay line is synchronized to the first delay line and while the phase difference between the clock signal and the data signal ranges within a second phase range, delaying the clock signal in the second delay line by a delay ranging within a second tuning range to produce a second delayed clock signal, and sampling the data signal responsive to the second delayed clock signal.

11. The method of claim 10, further comprising:

producing a control signal responsive to the phase difference between the clock signal and the data signal, wherein the delaying the clock signal in the first delay line and the delaying of the clock signal in the second delay line are both responsive to the control signal.

12. The method of claim 10, further comprising:

detecting a synchronization of the second delay line to the first delay line by detecting a phase difference between the first delayed clock signal and the second delayed clock signal.

13. The method of claim 12, wherein said detecting the synchronization of the second delay line to the first delay line further comprises processing the phase difference in a loop filter.

14. The method of claim 10, further comprising:

blocking the clock signal from driving the second delay line while the phase difference between the clock signal and the data signal ranges within the first phase range; and blocking the clock signal from driving the first delay line while the phase difference between the clock signal and the data signal ranges within the second phase range.

15. A delay-locked loop, comprising:

a first delay line having a first delay operating range;

a second delay line having a second delay operating range;

a clock data recovery circuit configured to determine a phase difference between a clock signal and a data signal; and means for selecting the first delay line to delay the clock signal to form an output clock signal responsive to the phase difference corresponding to a delay within the first delay operating range and for selecting the second delay line to delay the clock signal to form the output clock signal responsive to the phase difference corresponding to a delay within the second delay operating range.

16. The delay-locked loop of claim 15, wherein the delay-locked loop is included within a receiver having a slicer configured to sample the data signal responsive to the output clock signal.

17. The delay-locked loop of claim 16, wherein the receiver is configured to receive the clock signal from a remote source-synchronous source, and wherein the receiver is further configured to receive the data signal from the remote source-synchronous source.

18. The delay-locked loop of claim 15, wherein the clock data recovery circuit is an analog clock data recovery circuit.

19. The delay-locked loop of claim 15, wherein the clock data recovery circuit is a digital clock data recovery circuit.

* * * * *